United States Patent [19]
Herdt et al.

[11] Patent Number: 5,602,776
[45] Date of Patent: Feb. 11, 1997

[54] NON-VOLATILE, STATIC RANDOM ACCESS MEMORY WITH CURRENT LIMITING

[75] Inventors: Christian E. Herdt, Monument; Albert S. Weiner, Colorado Springs, both of Colo.

[73] Assignee: Simtek Corporation, Colorado Springs, Colo.

[21] Appl. No.: 549,483

[22] Filed: Oct. 27, 1995

Related U.S. Application Data

[63] Continuation of Ser. No. 323,814, Oct. 17, 1994, abandoned.

[51] Int. Cl.$^6$ .................................................. G11C 11/34
[52] U.S. Cl. ............................... 365/185.08; 365/185.05; 365/154
[58] Field of Search ......................... 365/185, 154, 365/156, 185.05, 185.08; 371/66

[56] References Cited

U.S. PATENT DOCUMENTS

| | | | |
|---|---|---|---|
| 4,158,241 | 6/1979 | Takemae et al. | 365/205 |
| 4,527,255 | 7/1985 | Keshtbod | 365/154 |
| 4,651,303 | 3/1987 | Dias et al. | 365/154 X |
| 4,703,456 | 10/1987 | Arakawa | 365/154 X |
| 4,799,194 | 1/1989 | Arakawa | 365/156 X |
| 5,051,958 | 9/1991 | Arakawa | 365/185.08 |
| 5,065,362 | 11/1991 | Herdt et al. | 365/154 |
| 5,097,449 | 3/1992 | Cuevas | 365/185.08 |
| 5,189,641 | 2/1993 | Arakawa | 365/185.08 |

*Primary Examiner*—David C. Nelms
*Assistant Examiner*—Huan Hoang
*Attorney, Agent, or Firm*—Sheridan Ross P.C.

[57] ABSTRACT

The present invention provides a non-volatile, static random access memory (nvSRAM) cell with a current limiting feature that prevents current that is provided to the cell or array of cells during a recall operation in which information is transferred from the non-volatile portion of the cell or array to the static random access memory portion of the cell or array from reaching a point that would be detrimental to the cell or array. The current limiting device is located between the nvSRAM cell or array of cells and ground. In one embodiment, the current limiting device includes a variable resistance and a device for modulating the resistance so that the resistance is high at the beginning of a recall operation and decreases thereafter.

18 Claims, 5 Drawing Sheets

NON-VOLATILE, STATIC RANDOM ACCESS MEMORY WITH CURRENT LIMITING

This is a continuation of application Ser. No. 08/323,814, filed on Oct. 17, 1994 now abandoned.

BACKGROUND OF THE INVENTION

1. Field of the Invention

The present invention relates to non-volatile, static random access memory (nvSRAM) devices and, in particular, to current limiting in such devices.

2. Description of the Related Art

A basic nvSRAM cell is comprised of a static random access memory (SRAM) cell that is capable of communicating a bit of data to and from an exterior environment and a non-volatile (nv) cell for providing backup storage to the SRAM cell in the event power is removed from the nvSRAM cell. More particularly, the SRAM cell is capable, as long as power is being provided, of receiving a bit of data from an exterior environment, retaining the bit of data, and transmitting the bit of data back to the exterior environment. If, however, power is removed from the SRAM cell, the SRAM cell will lose the bit of data. The nv cell prevents loss of the bit of data by providing the capability to receive the bit of data from the SRAM, retain the bit of data in the absence of power being provided to the SRAM cell, and return the bit of data to the SRAM cell when power is present. For example, if there is a possibility of power to the SRAM cell being lost, the bit of data can be transferred from the SRAM cell to the nv cell in a store operation. At a later time, the bit of data can be returned from the nv cell to the SRAM cell in a recall operation. The SRAM cell can then transmit the bit of data to the exterior environment, if desired.

Typically, the basic nvSRAM cell is combined with other nvSRAM cells to form a memory array that is integrated onto a single semiconductor chip. Typical nvSRAM memory arrays are comprised of 16,384, 65,536, and 262,144 nvSRAM cells. The motivation for creating integrated semiconductor chips with ever larger arrays of nvSRAM cells is that the area per cell decreases as more cells are integrated onto a chip. For example, two chips, each with arrays of 32,768 nvSRAM cells, occupy a greater surface area than a single chip with an array of 65,536 nvSRAM cells. The area occupied by a memory chip is important because many applications for the chip, such as personal computers, are continually attempting to provide more memory in less space.

Operation of nvSRAM arrays, like an individual nvSRAM cell, includes a store operation and a recall operation. The store operation, however, involves substantially simultaneously transferring all of the bits of information from all of the SRAM cells to all of the nv cells. Similarly, the recall operation involves substantially simultaneously transferring all the bits of information from all of the nv cells to all of the SRAM cells. Simultaneously transferring all of the bits of information in the recall operation may result in enough current being provided by the power supply that the chip is damaged. As a consequence, the nvSRAM array includes a relatively large resistor that, when the recall operation is in effect, is positioned between the power supply and the nvSRAM cells to prevent the current from reaching a level at which damage to the chip can occur. This current limiting approach, however, exhibits a number of problems. Specifically, this current limiting approach prevents, in certain instances, the recall operation from occurring, i.e., the bits cannot be correctly transferred from the nv cells to the SRAM cells. Moreover, this current limiting approach becomes increasingly difficult to implement as the size of the nvSRAM array increases. Furthermore, manufacturing difficulties that reduce manufacturing yields are experienced using this current limiting approach.

SUMMARY OF THE INVENTION

The present invention is directed to an nvSRAM device with a current limiting feature that addresses the deficiencies noted with respect to the current limiting approach of placing a relatively large resistor between the nvSRAM cells and the power supply. More specifically, the current limiting approach of the present invention remedies the recall problem of the prior approach, can be readily implemented with ever larger arrays, and reduces manufacturability concerns, thereby providing improved yields.

The nvSRAM device of the present invention includes an SRAM cell and an nv cell that are operatively connected to one another so that a bit of data can be transferred from the SRAM cell to the nv cell for backup storage in the event of power loss to the SRAM cell and, at a later time, transferred from the nv cell to the SRAM cell. To provide the nvSRAM cell with power, two structures are provided, one for connecting the nvSRAM cell to a power supply and the other for connecting the nvSRAM cell to ground. Unlike the prior nvSRAM in which current limiting is provided by a large resistor located between the nvSRAM cell and the power supply, the nvSRAM device of the present invention employs a current limiting device that is located between the nvSRAM and the structure connecting the cell to ground. Generally, the current limiting device provides a large resistance during the recall operation that prevents the current passing through the nvSRAM cell or an array of nvSRAM cells from reaching a point that would be detrimental. The resistance can be provided by a resistor or an appropriately biased transistor. To aid in the recall operation and subsequent operation of the nvSRAM cell, one embodiment of the current limiting device provides a variable resistance and a control device that modulates the resistance so that the resistance is high at the beginning of the recall operation and then low at the end of the recall operation and near zero for subsequent SRAM operations. In one embodiment, the modulation of the resistance is coordinated with the application of an increasing voltage to pull-up resistors in the SRAM cell to provide increased sensitivity or responsiveness. Moreover, in an array of nvSRAM cells, a number of variable resistance devices are provided, each of which is associated with one or a number of rows or columns of the array. In such an array, the low resistance for SRAM operations involving a particular row or column of the array is achieved by connecting the variable resistance devices in parallel. Due to this parallel connection, a much lower effective resistance is presented to the row in which SRAM operations are occurring than the single variable resistance device associated with the row. Further, by appropriately configuring the nv cell and, in particular, the thresholds of the devices used in the nv cell that are used to store the bit of data, the length of time that the nv cell can retain a bit of data can be more readily controlled.

DETAILED DESCRIPTION

Figure 1:
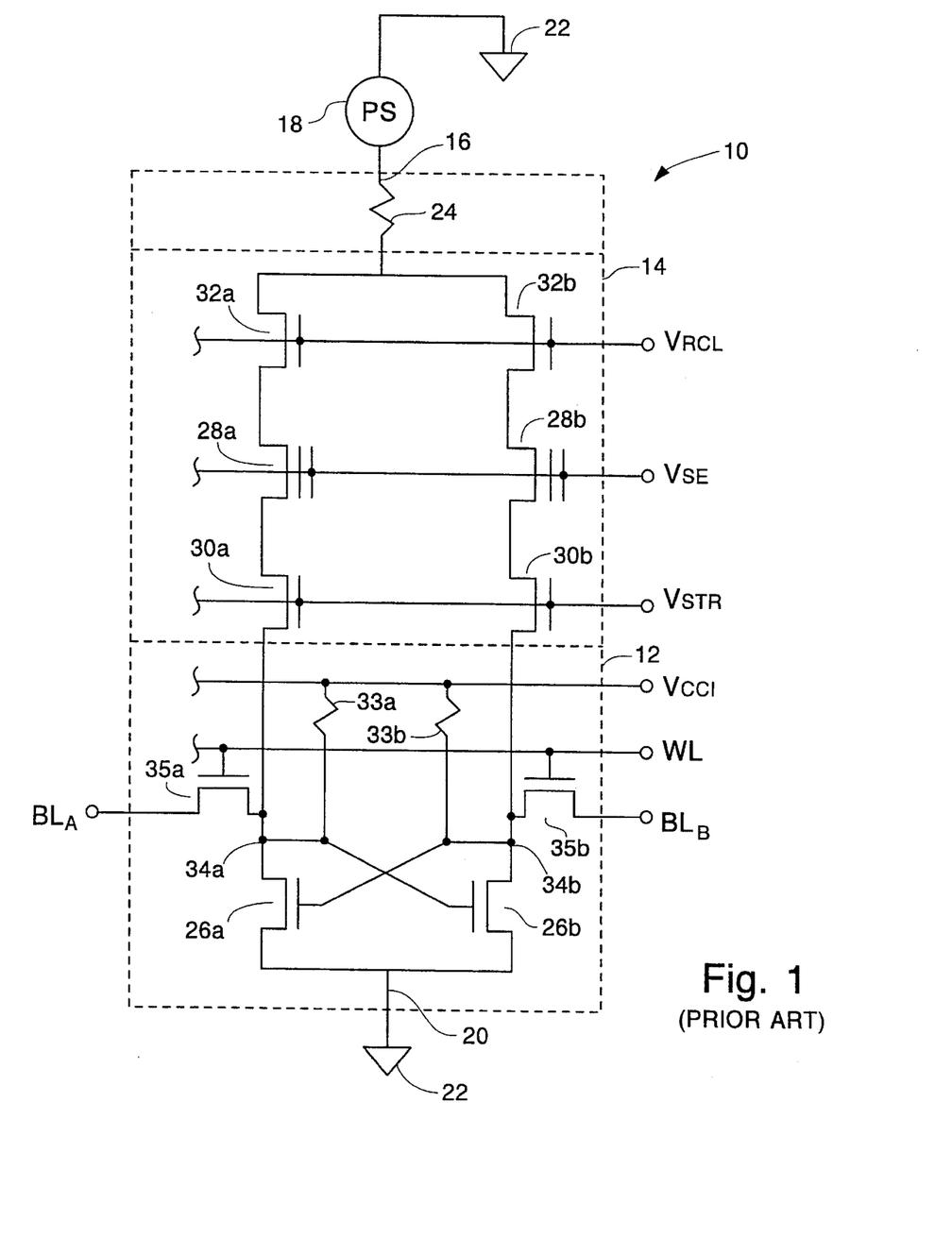
FIG. 1 illustrates an nvSRAM device with a large resistor for limiting the current supplied to an nvSRAM cell during recall operations interposed between the nvSRAM cell and the structure for connecting the device to a power supply.

FIG. 1 illustrates a known nvSRAM cell with current limiting, hereinafter nvSRAM device 10. At the outset, it should be appreciated that the nvSRAM cells discussed herein can be integrated onto a semiconductor chip with a plurality of other nvSRAM cells to form an array.

The nvSRAM device 10 includes an SRAM cell 12 that is capable of receiving a bit of data from an exterior environment via bit lines, storing the bit of data, and transmitting the bit of data back to the exterior environment via the bit line at a later time. In an array of nvSRAM cells, a group of sixteen bits, which is known as a word of information, is transferred to and from the exterior environment by the bit lines and word lines that enable a particular group of sixteen nvSRAM cells to transfer a word of information to or from the exterior environment via the bit lines. It should be appreciated that the array can be configured to transfer larger or smaller groups of bits to and from the exterior environment. For example, eights bits, which is known as a byte, can be transferred to and from the exterior environment. As previously mentioned, the SRAM cell 12 requires power to store a bit of data. If power is removed from the SRAM cell 12, the bit of data previously stored therein is lost.

The nvSRAM device 10 also includes an nv cell 14 that is capable of receiving a bit of data from the SRAM cell 12 in a store operation, retaining the bit of data even in the absence of power being provided to the nvSRAM device 10, and then transmitting the bit of data back to the SRAM cell 12 in a recall operation.

To provide power to the nvSRAM device 10, a power line 16 is provided for connecting the nvSRAM device 10 to a power supply 18 and a ground line 20 is provided for connecting the nvSRAM device 10 to ground 22.

Located between nv cell 14 and the power line 16 is a resistor 24 for limiting the current provided by the power supply 18 to the SRAM cell 12 and nv cell 14 during a recall operation. More specifically, the resistor 24 prevents a detrimental amount of current from being delivered by the power supply 18 to the nvSRAM device 10 during a recall operation.

With the foregoing general description of the nvSRAM device 10 in mind, the nvSRAM device 10 is now described in greater detail. Generally, the nvSRAM device 10 is comprised of a number of n-channel, Field-Effect Transistors (FETs) and resistors. It should, however, be appreciated that other types of transistors, such as p-channel FETs, and combinations of different types of transistors can be utilized.

The SRAM cell 12 includes a first SRAM FET 26a and a second SRAM FET 26b that are in a 1-bit latch configuration in which the drain of each FET is coupled to the gate of the other FET and the source of one FET is coupled to the source of the other FET. In the latch configuration, the first and second SRAM FETs 26a, 26b operate as switches that are either in an ON state or an OFF state. More specifically, the latch operates so that when one of the first and second SRAM FETs 26a, 26b is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET 26a in an OFF state and the second SRAM FET 26b in an ON state. Conversely, if the bit of data is in a 1 state, the latch can represent the 1 state of the bit by placing the first SRAM FET 26a in an ON state and a second SRAM FET 26b in an OFF state.

The SRAM cell 12 further includes first and second pull-up resistors 33a, 33b to aid the first and second SRAM FETs 26a, 26b in latching a bit of data from the nv cell 14 or from the exterior environment. The first pull-up resistor 33a is located between the drain of the first SRAM FET 26a, which is identified as node 34a, and a line that carries a $V_{ccI}$ voltage signal, a voltage signal internal to the chip that is substantially equal to the voltage provided by the external power supply 18. Similarly, the second pull-up resistor 33b is located between node 34b and the line that carries the $V_{ccI}$ voltage signal. There are a number of alternatives to the use of pull-up resistors. For example, depletion n-channel FETs or cross-coupled p-channel FETs can be utilized.

Also included in the SRAM cell 12 are first and second transfer FETs 35a, 35b for transferring a bit of data between the latch formed by the first and second SRAM FETs 26a, 26b and the exterior environment. The gate of each of the first and second transfer FETs 35a, 35b is connected to a word line WL; the drains of the first and second transfer FETs 35a, 35b are respectively connected to nodes 34a, 34b; and the sources of the first and second transfer FETs are respectively connected to bit lines $BL_A$ and $BL_B$. The first and second transfer FETs 35a, 35b function as switches that are placed in an ON state to transfer a bit of data between the latch and the exterior environment and otherwise placed in an OFF state. The state of the first and second transfer FETs 35a, 35b (ON or OFF) is controlled by a signal applied to the word line WL. If the first and second transfer FETs 35a, 35b are in an ON state, a bit of data can be transferred between the latch and the exterior environment via the bit lines $BL_A$, $BL_B$.

The nv cell 14 includes a first silicon nitride oxide semiconductor (SNOS) FET 28a and a second SNOS FET 28b for respectively storing the state of the first SRAM FET 26a and the second SRAM FET 26b. The state of the first and second SRAM FETs 26a, 26b is stored in the first and second SNOS FETs 28a, 28b by forcing, in a store operation, the threshold voltages for turning ON the first and second SNOS FETs 28a, 28b to reflect the states of the first and second SRAM FETs 26a, 26b. For example, if the first SRAM FET 26a is in an OFF state and the second n-channel 26b is in an ON state, the store operation would reflect this state of the first and second n-channel FETs 26a, 26b by forcing the threshold voltage for turning ON the first SNOS FET 28a to be less than the threshold voltage for turning ON the second SNOS FET 28b. It should be appreciated that the SNOS FETs can be replaced with other types of transistors that also have adjustable threshold voltages, such as floating gate transistors and ferroelectric transistors.

The nv cell 14 further includes a first store FET 30a and a second store FET 30b that operate as switches during store and recall operations to appropriately configure the nv cell 14 for the transfer of a bit of data between the SRAM cell 12 and the nv cell 14. More specifically, the first and second store FETs 30a, 30b function to connect the nv cell 14 to the SRAM cell 12 during store and recall operations and to otherwise disconnect the nv cell 14 from the SRAM cell 12. The state of the first and second store FETs 30a, 30b is controlled by a $V_{STR}$ signal that is applied to the gates of the FETs. More specifically, if the $V_{STR}$ signal is LOW, the first and second store FETs 30a, 30b are turned OFF to disconnect the nv cell 14 from the SRAM cell 12. Conversely, if the $V_{STR}$ signal is HIGH, the first and second store FETs 30a, 30b are turned ON to connect the nv cell 14 to the SRAM cell 12.

The nv cell 14 further includes a first recall FET 32a and a second recall FET 32b which also function as switches to place the nv cell 14 in the appropriate configuration for transferring a bit of data between the SRAM cell 12 and the nv cell 14 during store and recall operations. More specifically, the first and second recall FETs 32a, 32b function to connect the nv cell 14 to the power supply 18 during a recall operation and to disconnect the nv cell 14 from the power supply 18 during a store operation and otherwise. The state of the first and second recall FETs 32a, 32b is controlled by a $V_{RCL}$ signal that is applied to the gates of the FETs. More specifically, if the $V_{RCL}$ signal is LOW, the first and second recall FETs 32a, 32b are turned OFF to disconnect the nv cell 14 from the power supply 18. Conversely, if the $V_{RCL}$ signal is HIGH, the first and second recall FETs 32a, 32b are turned ON to connect the nv cell 14 to the power supply 18.

With the foregoing description of the elements of the nvSRAM device 10 in mind, the store operation of the nvSRAM device 10 is now described. The store operation is initiated by connecting the nv cell 14 to the SRAM 12 by placing $V_{STR}$ in a HIGH condition to turn ON the first and second store n-channel FETs 30a, 30b. Previously, the nv cell 14 has been disconnected from the power supply 18 by placing $V_{RCL}$ in a LOW condition to turn OFF the first and second recall FETs 32a, 32b. Next $V_{SE}$ is cycled from ground to a large negative voltage (referred to as an erase voltage) to place the first and second SNOS FETs 28a, 28b in a known condition and then to a large positive voltage (referred to as a program voltage) to establish different threshold levels in the first and second SNOS FETs 28a, 28b that reflect the state of the first and second SRAM FETs 26a, 26b of the SRAM cell 12. For example, if the first SRAM FET 26a is in an OFF state and the second SRAM FET 26b is in an ON state, the cycling of $V_{SE}$ results in the threshold voltage of the first SNOS FET 28a being set lower than the threshold voltage of the second SNOS FET 28b, thereby reflecting the state of the first and second SRAM FETs 26a, 26b. After $V_{SE}$ has been cycled, $V_{SE}$ is placed in a LOW state and $V_{STR}$ is placed in a LOW state to turn OFF the first and second store FETs 30a, 30b and thereby disconnect the nv cell 14 from the SRAM cell 12.

The recall operation of the nvSRAM device 10 commences with the use of the bit lines $BL_A$, $BL_B$ and word line WL to ground nodes 34a, 34b and thereby turn OFF both the first and second SRAM FETs 26a, 26b. The word line WL is then turned OFF to isolate the cells. Next, $V_{SE}$ is used to place the first and second SNOS FETs 28a, 28b in a condition in which one of the FETs is ON and the other is OFF; $V_{STR}$ is placed in a HIGH condition to turn ON both the first and second store FETs 30a, 30b and thereby connect the nv cell 14 to the SRAM cell 12; $V_{RCL}$ is placed in a HIGH condition to turn ON both the first and second recall FETs 32a, 32b and thereby connect the nv cell 14 to the power supply 18; and the voltage signal $V_{CCI}$ is applied to the pull-up resistors 33a, 33b. As a result, the appropriate voltage is established between the gate and drain of one of the first and second SRAM FETs 26a, 26b to turn it ON while the other FET is left turned OFF. Thus, the bit of data that was stored in the nv cell 14 is transferred to the SRAM cell 12. Continuing with the example in which the store operation established a lower threshold voltage for the first SNOS FET 28a relative to the second SNOS FET 28b, the aforementioned sequence of steps for the recall operation produces the appropriate voltage at node 34a to turn ON the second SRAM FET 26b and turn OFF the first SRAM FET 26a, thereby returning the bit of data to the SRAM cell 12 that was previously transferred from the SRAM 12 to the nv cell 14.

Figure 2:
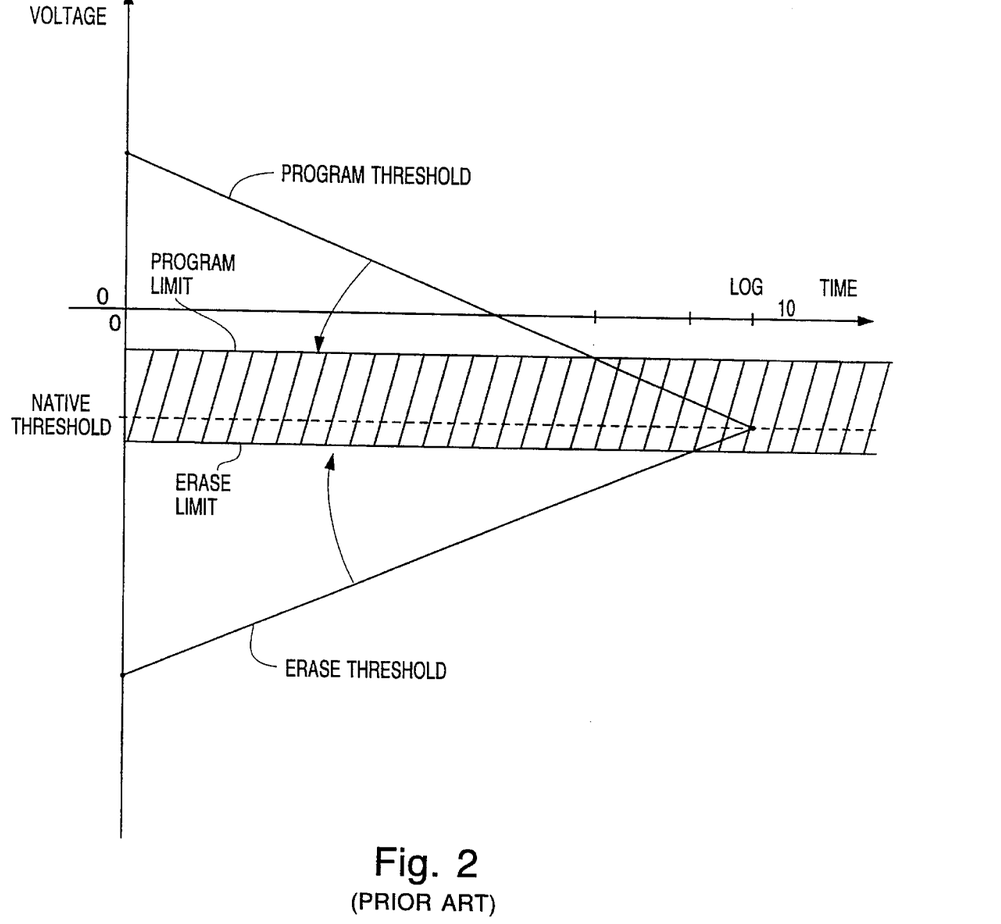
FIG. 2 illustrates the decay of the thresholds of the devices in the nv cell of the nvSRAM device illustrated in FIG. 1 that store a bit of data and the points of decay beyond which recall is not feasible for the nvSRAM device.

The ability to transfer a bit of data from the nv cell 14 to the SRAM cell 12, i.e., perform a recall operation, is limited. With reference to FIG. 2, both the erase threshold, i.e., the more negative threshold, and the program threshold, i.e., the more positive threshold, associated with the first and second SNOS FETs 28a, 28b decay over time and define a triangular window of operation. Once the erase threshold equals the program threshold, the differential characteristic of the thresholds that identified the stored bit as a 0 or a 1 is no longer present and, as a consequence, the ability to perform the recall operation no longer exists. The point at which the erase threshold equals the program threshold is called the native threshold.

As a practical matter, the recall operation is inhibited before the erase and program thresholds decay to the native threshold by the operational characteristics of the elements comprising the nvSRAM device 10. In this regard, there are two limits upon the ability to recall information from the nv cell 14 to the SRAM cell 12. The first limit, the erase limit, is associated with the erase threshold. Specifically, if the erase threshold decays past the erase limit, the recall operation cannot be accomplished. To continue with the prior example, if the threshold for turning ON the second SRAM FET 26b is one volt and the erase threshold associated with the first SNOS FET 28a has decayed to a value of greater than −1 volt, then there is insufficient gate to source voltage at node 34a to turn ON the second SRAM FET 26b during the recall operation. Further, if the second SRAM FET 26b cannot be turned ON, the first SRAM FET 26a cannot be turned OFF. Stated differently, the SRAM cell 12 cannot latch the bit of data from the nv cell 14. Stated yet another way, the SRAM cell 12 cannot be placed in the same state, i.e., with the first SRAM FET 26a in an OFF state and the second SRAM FET 26b in an ON state, as when the bit of data was transferred from the SRAM cell 12 to the nv cell 14.

The second limit, termed the program limit, is associated with the program threshold. Specifically, if the program threshold decays past the program limit, the recall operation is inhibited. To continue with the prior example, if the program threshold decays to a point past the program limit and a recall operation is initiated, the second SNOS FET 28b turns ON to a degree that permits a sufficient gate to source voltage to be built up at the second node 34b and thereby turn ON the first SRAM FET 26a. The state of the first SRAM FET 26a should, however, be OFF. Furthermore, the recall operation, as previously discussed, has turned ON the second SRAM FET 26b. Since both the first and second n-channel FETs 26a, 26b are turned ON, rather than the first SRAM FET 26a being turned OFF and the second SRAM FET 26b being turned ON, the recall operation has failed.

In addition to the failed recall operation, there is a further consequence of the sequence of events that occur when the program limit is exceeded. Specifically, current from the power supply flows down both the first and second sides of the nvSRAM cell 10, where the first side comprises the first SRAM FET 26a, the first SNOS FET 28a, the first store FET 30a and the first recall FET 32a, and the second side comprises the second SRAM FET 26b, the second SNOS FET 28b, the second store FET 30b, and the second recall FET 32b. In a large array of nvSRAM cells, the current provided by the power supply 18 in such a situation can reach a point at which the chip is damaged. The current limiting resistor 24, however, prevents the current from reaching this point. Nonetheless, the current limiting resistor 24 can also inhibit the recall operation. Specifically, if the voltage across the current limiting resistor 24, as a result of a large current being provided by the power supply 18, becomes sufficiently large, then there is inadequate voltage to establish the differential gate to source voltage necessary to turn ON either the first or second SRAM FETs 26a, 26b. Stated differently, there is insufficient voltage to latch the bit of data from the nv cell 14 into the SRAM cell 12.

With continuing reference to FIG. 2, the relationship of the thresholds to the limits associated with the nvSRAM 10 create various design and manufacturing concerns related to the length of time over which a recall operation can be accomplished. Specifically, it is desirable to make the difference between the erase limit and program limit as small as possible and to center the window in the band between the erase and program limits to maximize the period over which the recall operation can be accomplished.

Figure 3:
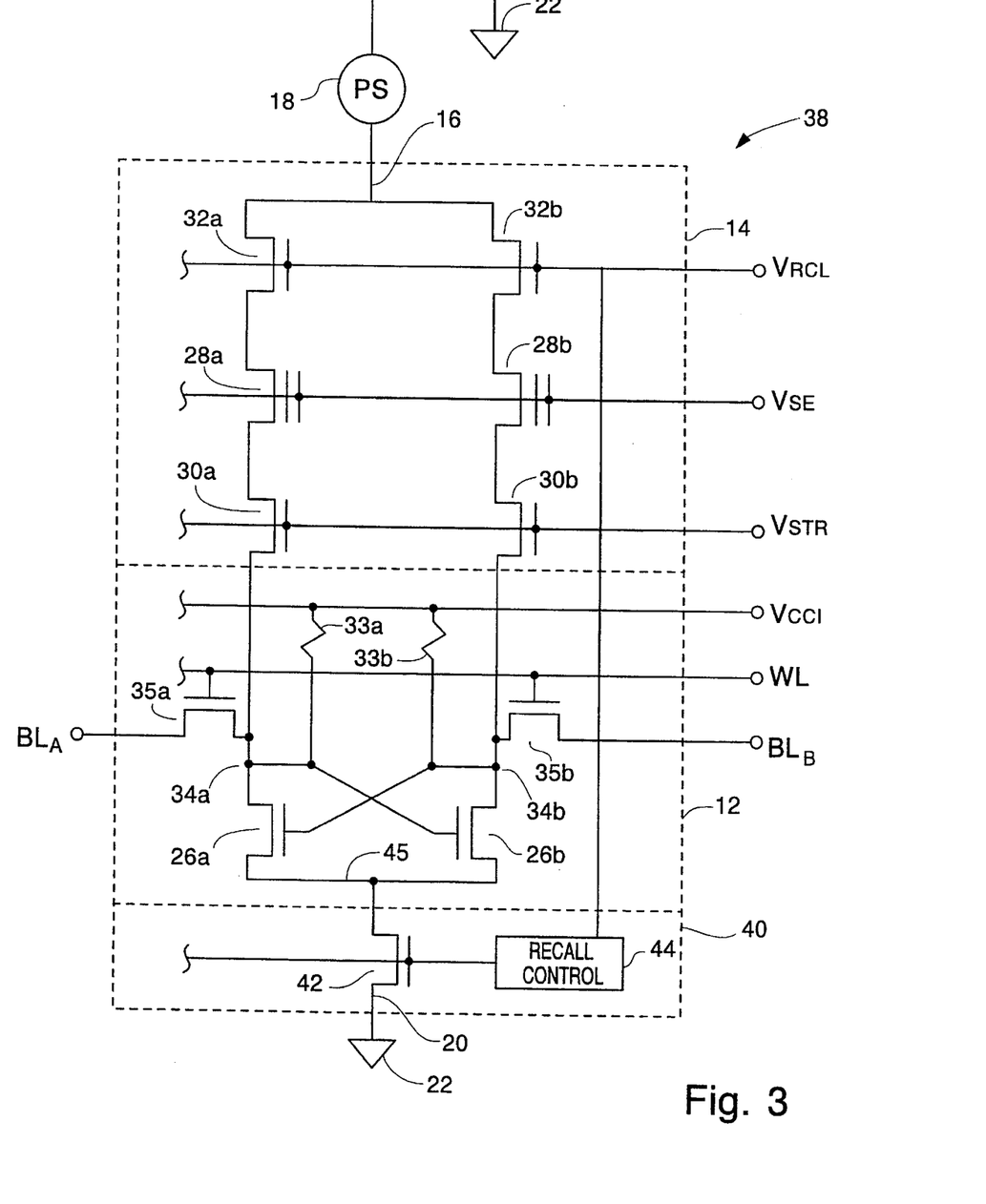
FIG. 3 illustrates an nvSRAM device with a current limiting device located between an nvSRAM cell and the structure for connecting the device ground.

With the foregoing in mind and with reference to FIG. 3, the nvSRAM device of the present invention, hereinafter SRAM device 38 is described. A substantial number of the elements comprising the nvSRAM device 38 are the same type of elements as those described with respect to nvSRAM device 10. As a consequence, these elements have been given the same reference numbers as the corresponding elements identified with respect to nvSRAM device 10. Further, the same reference numbers for the power supply and ground are used in describing the nvSRAM device 38 as were used in describing the nvSRAM device 10.

The nvSRAM device 38 includes an SRAM cell 12 that is capable of transferring a bit of data to and from an exterior environment as well as to and from an nv cell 14. The nv cell 14 is capable of retaining the bit of data provided by the SRAM cell 12, even in the absence of power being provided to the nvSRAM device 38. The nvSRAM device 38 further includes a power line 16 for connecting the nvSRAM cell 38 to a power supply 18. However, unlike the nvSRAM cell 10, there is no current limiting resistor between the power line 16 and the nv cell 14. Also included in the nvSRAM device 38 is a ground line 20 for connecting the nvSRAM device 38 to a ground 22.

Unlike the nvSRAM device 10, the nvSRAM device 38 includes a current limiting device 40 located between the SRAM cell 12 and the ground line 20 to, among other things, limit the current provided by the power supply 18 so that it does not exceed a point at which the nvSRAM device 38 or an array in which the nvSRAM device 38 resides would be damaged. The current limiting device 40 includes a variable resistance FET 42 and a recall control device 44 that, in coordination with the $V_{RCL}$ Signal, adjusts the gate to source voltage of the variable resistance FET 42 to change the resistance provided by the FET. More specifically, when the $V_{RCL}$ signal is in a HIGH condition, the recall control device 44 adjusts the resistance of the variable resistance FET 42 so that it is relatively high at the start of the recall operation. Thereafter, the recall control device 44 decreases the resistance provided by the variable resistance FET 42. When the $V_{RCL}$ Signal is in a LOW condition, the recall control device 44 adjusts the resistance of the variable resistance FET 42 so that it is very low.

Also, unlike the nvSRAM device 10, the first and second SNOS FETs 26a, 26b of the nv cell 14 are fabricated so that one will always turn ON during a recall operation regardless of the length of time the data has been retained, although both of the SNOS FETs 26a, 26b may be turned ON due to process variations and/or retention time. More specifically, the first and second SNOS FETs 28a, 28b are fabricated so that one of the two, thresholds established during the store operation and reflective of the state of the first and second SRAM FETs 26a, 26b is less than the gate to source voltage established by the $V_{SE}$ signal during a recall operation by at least the erase limit. In any event, at least one of the first and second SNOS FETs 26a, 26b must be designed to turn ON during a recall operation.

Having described the nvSRAM device 38, the store and recall operations associated therewith are now described. The store operation commences with $V_{STR}$ being placed in a HIGH condition to turn ON the first and second store FETs 30a, 30b and thereby connect the nv cell 14 to the SRAM cell 12; and the $V_{RCL}$ signal is placed in a LOW condition to turn OFF the first and second recall FETs 32a, 32b and thereby disconnect the nv cell 14 from the power supply 18. At the same time, the recall control device 44 places the variable resistance FET 42 in a state in which it provides little resistance. Subsequently, the $V_{SE}$ signal is cycled from ground to a large negative voltage and then to a large positive voltage to establish the two, different thresholds in the first and second SNOS FETs 28a, 28b that are reflective of the state of the first and second SRAM FETs 26a, 26b. Moreover, at least one of the two, different thresholds must be less than the value of the $V_{SE}$ signal applied during a recall operation. Alternatively, both of the thresholds can be set to values that are less than the value of the $V_{SE}$ signal applied to the SNOS FETs 28a, 28b during the recall operation and, as a consequence, always be turned ON during a recall operation.

The recall operation, as before, commences by using the bit lines $BL_A$, $BL_B$ and word line WL to ground nodes 34a, 34b and thereby turn OFF the first and second SRAM FETs 26a, 26b. The word line WL is then turned OFF to isolate the cells. Subsequently, the $V_{STR}$ is placed in a HIGH condition to turn ON the first and second store FETs 30a, 30b and thereby connect the nv cell 14 to the SRAM cell 12; the $V_{SE}$ signal is set at ground; the $V_{RCL}$ is placed in a HIGH condition to turn ON the first and second recall FETs 32a, 32b. At the same time, the recall control device 44 places the variable resistance FET 42 in a condition in which it provides a high resistance at the beginning of the recall operation that thereafter decreases. Since the $V_{SE}$ signal is greater than or equal to the threshold of at least one of the first and second SNOS FETs 28a, 28b, at least one of the first and second SNOS FETs 28a, 28b is turned ON. If, due to the decay of one of the thresholds or the establishment of both thresholds at levels below $V_{SE}$, both the first and second SNOS FETs 28a, 28b are turned ON, then one of the FETs is turned ON to a greater degree than the other. The degree to which an FET is turned ON can be modeled by a resistor, the greater the resistance of the resistor, the less the FET is turned ON. In any event, two different voltages are established at nodes 34a, 34b that reflect the different thresholds of the first and second SNOS FETs 28a, 28b. Further, the high resistance provided by the variable resistance FET 42 has, in combination with the voltages at nodes 34a, 34b, established gate to source voltages that result in at least one of the first and second SRAM FETs 26a, 26b being turned ON. More specifically, one of the first and second SRAM FETs 26a, 26b is turned ON more than the other. The recall control device 44, by reducing the resistance provided by the variable resistance FET 42, then forces the FETs to latch the bit of data from the nv cell 14, i.e., the FET that is less ON is forced to an OFF state and the FET that is more ON remains ON as the resistance provided by the variable resistance FET 42 decreases.

A further aspect of the recall operation is that the change in the resistance of the variable resistance FET 42 is coordinated with the application of the $V_{CCI}$ voltage signal to the pull-up resistors 33a, 33b to increase the sensitivity of the recall operation, i.e., establish a larger differential voltage between nodes 34a, 34b faster and thereby latch the bit of data more reliably. More specifically, as previously discussed, the recall control device 44 causes the variable resistance FET 42 to provide a relatively high resistance at the beginning of the recall operation and thereafter causes the resistance to decrease. As the resistance of the variable resistance FET 42 decreases, the lower voltage of the two voltages at nodes 34a, 34b is further lowered. The coordination of the application of the $V_{CCI}$ voltage signal with the change in resistance of the variable resistance FET 42 involves initially establishing the $V_{CCI}$ voltage signal as the voltage of node 45. As the resistance of the variable resistance FET 42 decreases, the $V_{CCI}$ voltage signal is increased until it reaches the internal voltage that is substantially equal to the voltage provided by the power supply 18. As a result, the higher voltage of the two voltages at nodes 34a, 34b is driven yet higher while the lower of the two voltages is prevented from increasing by virtue of the SRAM FET on the opposite side being turned ON. The current surge provided by the pull-up resistors 33a and 33b as well as the associated capacitive coupling pulls up on the node 34a, 34b with the higher voltage. The establishment of the voltage signal $V_{CCI}$ at the voltage of node 45 and at the internal voltage substantially equal to that provided by the power supply is achieved by the recall control device 44 appropriately controlling switches that apply these voltages to the $V_{CCI}$ line.

Continuing with the prior example, if the store operation has established a threshold for the first SNOS FET 28a that is less than the threshold established for the second SNOS FET 28b and a recall operation is initiated, a differential voltage is established between nodes 34a and 34b with the voltage at node 34a being greater than the voltage at node 34b, thereby reflecting the different thresholds associated with the first and second SNOS 28a, 28b. Further, the voltage at node 34a and the voltage across the variable resistance FET 42 establish a voltage between the gate and source of the second SRAM FET 26b that turns ON the second SRAM FET 26b. Likewise, the voltage at node 34b and the voltage across the variable resistance FET 42, establish a gate to source voltage that turns ON the first SRAM FET 26a, although to a lesser degree than the second SRAM FET 26b. As the resistance of the variable resistance FET 42 is reduced by the recall control device 44 in coordination with the increase of the $V_{CCI}$ signal, the second SRAM FET 26b remains turned ON but the first SRAM FET 26a turns OFF, thereby accurately reflecting the thresholds of the first and second SNOS FETs 28a, 28b or, stated differently, latching the bit of data from the nv cell 14 into the SRAM cell 12.

Figure 4:
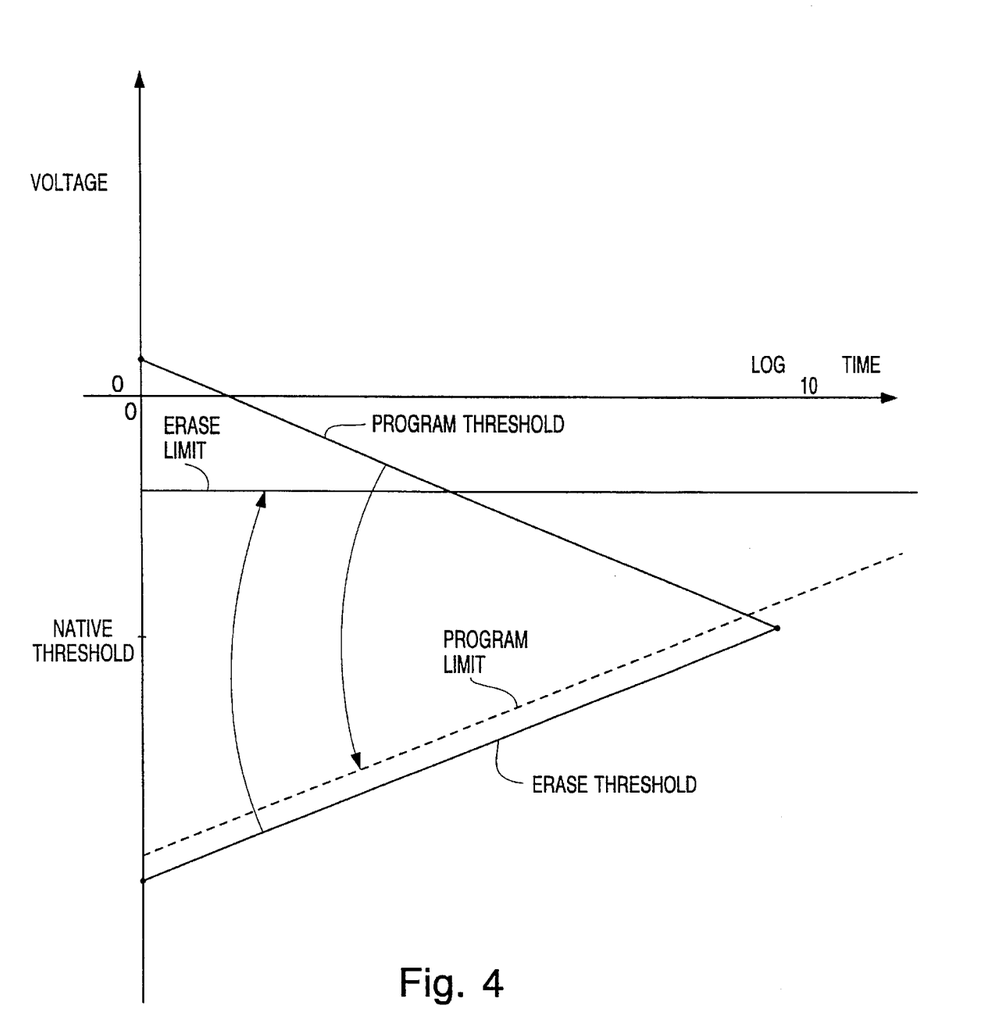
FIG. 4 illustrates the decay of the thresholds of the devices in the nv cell of the nvSRAM device illustrated in FIG. 3 that store a bit of data and the point beyond which recall is not feasible for the nvSRAM device.

With reference to FIG. 4, the relationship of the thresholds to the limits on a recall operation for the nvSRAM cell 38 are discussed. As before, both the erase and program thresholds decay towards a native threshold and define a window of operation. The erase limit is, as before, a fixed limit. However, the program limit is now variable and substantially shadows the erase threshold. Further, the relationship of the erase limit to the program limit for the nvSRAM device 38 is different than for the nvSRAM device 10. Specifically, and with reference to FIG. 2, the erase limit for the nvSRAM device 10 is located below the native threshold. Likewise, the program limit is located above the native threshold. This difference between the program limit and the erase limit represents an area of invalid data. In contrast, and with reference to FIG. 4, the erase limit for the nvSRAM device 38 is located significantly above the native threshold and, since the sensing is differential, the program limit is located a fixed amount above the erase threshold. Furthermore, from FIG. 4, it is apparent that the erase limit is no longer of concern because the erase threshold will never cross the native threshold. Consequently, the program limit is always attained before the erase limit. Moreover, the design and manufacturing concerns associated with the nvSRAM device 10 of centering the window in the band between the erase and program limits, and minimizing the difference between the erase and program limits is dispensed within the nvSRAM device 38.

Figure 5:
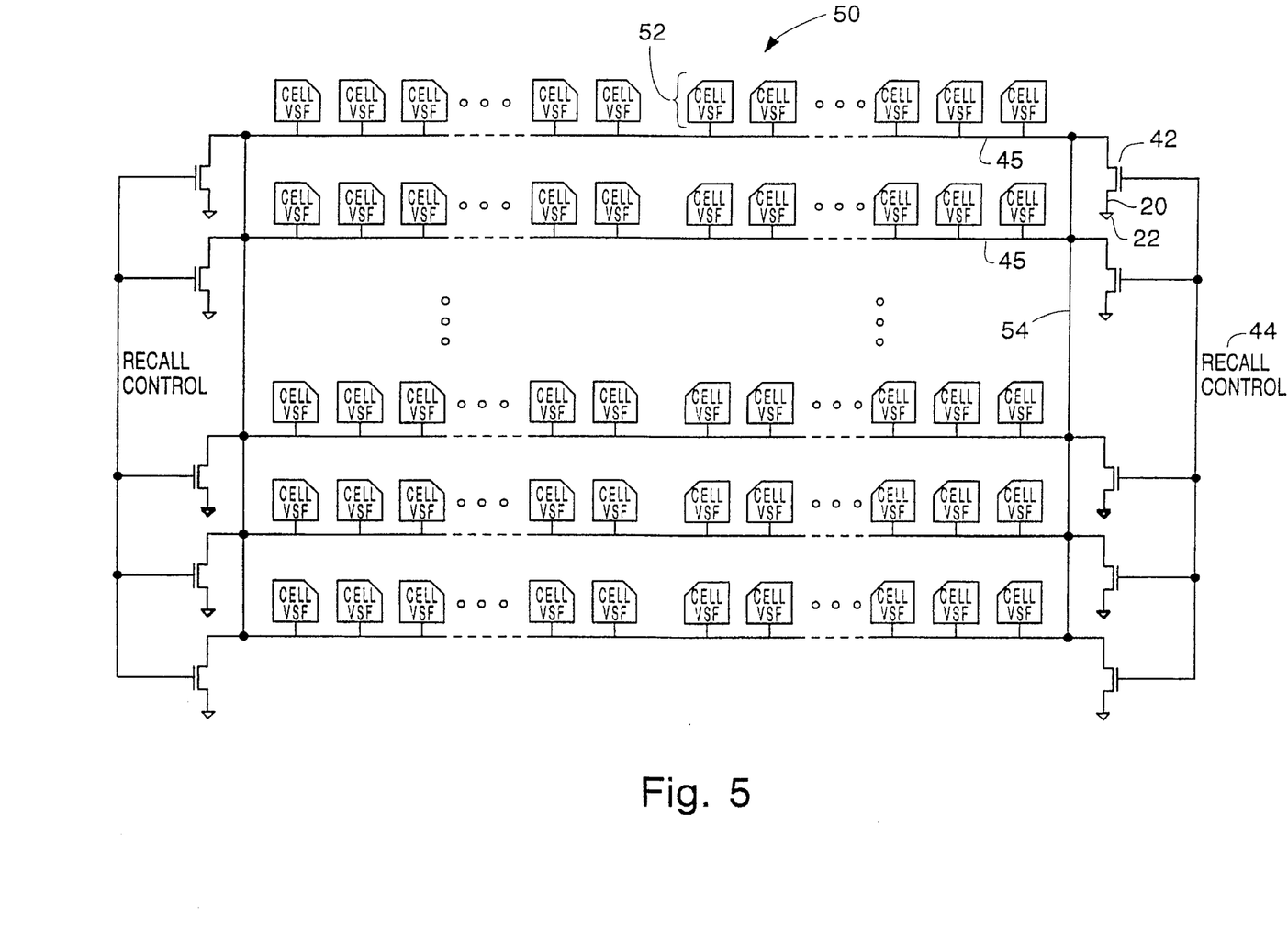
FIG. 5 illustrates an array of nvSRAM cells in which groups of nvSRAM cells share a current limiting device.

FIG. 5 illustrates an array 50 of nvSRAM cells with each of the nvSRAM cells comprised of the SRAM cell 12 and nv cell 14 discussed in connection with FIG. 3. (The array 50 can be a sub-array of a larger array.) The array 50 is comprised of a plurality of rows 52 of nvSRAM cells in which the cells comprising a row share the variable resistance FET 42. The recall control device 44 controls the variable resistance FETs 42 associated with each row 52 of the array 50. Further, the variable resistance FETs 42 associated with a plurality of the rows are connected in parallel by a vertical strap 54 to facilitate SRAM operations, i.e., transfers of data to and from the exterior environment. More specifically, SRAM operations are conducted one row at a time. In contrast, the store and recall operations associated with transfers between the SRAM and nv cells are conducted on an array basis, i.e., the transfer occurs between all of the SRAM and nv cells at the same time. As discussed with respect to the embodiment illustrated in FIG. 3, it is desirable to have the variable resistance FET 42 provide very small resistance during SRAM operations. In the array 50, the small resistance is achieved by having the recall control device 44 set each of the variable resistance FETs 42 to provide a small resistance during an SRAM operation involving a single row of the array. Since the vertical strap 54 connects the variable resistance FETs 42 in parallel, the effective resistance presented to the row on which the SRAM operation is occurring is less than the resistance being provided by the single variable resistance FET 42 associated with the row on which the SRAM operation is occurring. For example, if the resistance associated with each variable resistance FET is the same and the vertical strap 54 connects the variable resistance FETs 42 associated with 512 rows in parallel, the effective resistance presented to the row on which an SRAM operation is occurring is 512 times less than the resistance of the single variable resistance FET 42 associated with the row.

The foregoing description of the invention has been presented for purposes of illustration and description. Further, the description is not intended to limit the variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. A non-volatile, static random access memory device with improved current limiting, comprising:

a memory cell comprised of a static random access memory for retaining a bit of data that, if power is removed therefrom, can be lost, and a non-volatile memory that is capable of retaining said bit of data even after power has been removed from said memory cell;

first means for use in transferring a bit of data between said memory cell and an exterior environment;

second means, extending from said static random access memory to said non-volatile memory, for use in transferring a bit of data from said static random access memory to said non-volatile memory and from said non-volatile memory to said static random access memory;

third means for operatively connecting said memory cell to a control means for controlling transfer of a bit of data between said static random access memory and said non-volatile memory;

means for operatively connecting said memory cell to a power supply;

means for operatively connecting said memory cell to a ground, wherein said means for operatively connecting said memory cell to the ground is different from said first, second and third means; and means, located between said memory cell and said means for operatively connecting said memory cell to the ground, for limiting the current to be provided by the power supply to said memory cell.

2. A non-volatile, static random access memory device, as claimed in claim 1, wherein:

said means for limiting current includes a resistor.

3. A non-volatile, static random access memory device, as claimed in claim 1, wherein:

said means for limiting current includes a variable resistor.

4. A non-volatile, static random access memory device, as claimed in claim 1, wherein:

said means for limiting current includes a variable resistor and means for changing the resistance provided by said variable resistor.

5. A non-volatile, static random access memory device with improved current limiting, comprising:

a memory cell comprised of a static random access memory for retaining a bit of data that, if power is removed therefrom, can be lost, and a non-volatile memory that is capable of retaining said bit of data even after power has been removed from said memory cell;

means for operatively connecting said memory cell to a power supply;

means for operatively connecting said memory cell to a ground; and means, located between said memory cell and said means for operatively connecting said memory cell to the ground, for limiting the current to be provided by the power supply to said memory cell;

wherein said means for limiting current includes a variable resistor and means for changing the resistance provided by said variable resistor so that the resistance is relatively high at the beginning of a recall operation and relatively low at the end of the recall operation.

6. A non-volatile, static random access memory device, as claimed in claim 1, wherein:

said means for limiting current includes a transistor.

7. A non-volatile, static random access memory device with improved current limiting, comprising:

a memory cell comprised of a static random access memory for retaining a bit of data that, if power is removed therefrom, can be lost, and a non-volatile memory that is capable of retaining said bit of data even after power has been removed from said memory cell;

means for operatively connecting said memory cell to a power supply;

means for operatively connecting said memory cell to a ground; and means, located between said memory cell and said means for operatively connecting said memory cell to the ground, for limiting the current to be provided by the power supply to said memory cell;

wherein said means for limiting current includes a transistor and means for varying the resistance provided by said transistor.

8. A non-volatile, static random access memory device with improved current limiting, comprising:

a memory cell comprised of a static random access memory for retaining a bit of data that, if power is removed therefrom, can be lost, and a non-volatile memory that is capable of retaining said bit of data even after power has been removed from said memory cell;

means for operatively connecting said memory cell to a power supply;

means for operatively connecting said memory cell to a ground; and means, located between said memory cell and said means for operatively connecting said memory cell to the ground, for limiting the current to be provided by the power supply to said memory cell;

wherein said means for limiting current includes a transistor and means for varying the resistance provided by said transistor so that said resistance is relatively high at the beginning of a recall operation and relatively low at the end of said recall operation.

9. A non-volatile static random access memory device with improved current limiting, comprising:

a memory cell comprised of a static random access memory for retaining a bit of data that, if power is removed therefrom, can be lost, and a non-volatile memory that is capable of retaining said bit of data even after power has been removed from said memory cell;

means for operatively connecting said memory cell to a power supply;

means for operatively connecting said memory cell to a ground; and means, located between said memory cell and said means for operatively connecting said memory cell to the ground, for limiting the current to be provided by the power supply to said memory cell;

wherein said memory cell includes means for providing a pull-up resistance;

wherein said means for limiting current includes a variable resistor and means for changing the resistance provided by said variable resistor so that the resistance provided by said variable resistor is relatively high at the beginning of a recall operation and decreases thereafter.

10. A non-volatile, static random access memory device, as claimed in claim 9, further comprising:

means for increasing a voltage applied to said means for providing a pull-up resistance as the resistance of said variable resistor is decreased to provide sensitivity.

11. A non-volatile, static random access memory device with current limiting, comprising:

a memory cell comprising:
- a static random access memory that is capable of receiving a bit of data from an exterior environment, retaining said bit of data, and transmitting said bit of data to the exterior environment;
- wherein said bit of data can be lost if power is removed from said static random access memory;
- a non-volatile memory, operatively connected to said static random access memory, that is capable of receiving said bit of data from said static random access memory prior to the possible removal of power from said memory cell, retaining said bit of data even after removal of power from said memory cell, and transmitting said bit of data back to said static random access memory when power is being provided to said memory cell;
- wherein the capability of said non-volatile memory to receive said bit of data from said static random access memory constitutes a store operation;
- wherein the capability of said non-volatile memory to transmit said bit of data back to said static random access memory constitutes a recall operation;
- first means for use in transferring said bit of data from said memory cell to an exterior environment;
- second means, extending from said static random access memory to said non-volatile memory, for use in transferring said bit of data from said static random access memory to said non-volatile memory and from said non-volatile memory to said static random access memory
- third means for operatively connecting said memory cell to a control means for effecting store and recall operations;
- means for operatively connecting said memory cell to a power supply;
- means for operatively connecting said memory cell to a ground, wherein said means for operatively connecting said memory cell to the ground is different from said first, second and third means; and
- means, located between said memory cell and said means for operatively connecting said memory cell to the ground, for limiting the current to be provided by the power supply to said memory cell.

12. A non-volatile, static random access memory device with current limiting, comprising:

a memory cell comprising:
- a static random access memory that is capable of receiving a bit of data from an exterior environment, retaining said bit of data, and transmitting said bit of data to the exterior environment;
- wherein said bit of data can be lost if power is removed from said static random access memory;
- a non-volatile memory, operatively connected to said static random access memory, that is capable of receiving said bit of data from said static random access memory prior to the possible removal of power from said memory cell, retaining said bit of data even after removal of power from said memory cell, and transmitting said bit of data back to said static random access memory when power is being provided to said memory cell;
- wherein the capability of said non-volatile memory to receive said bit of data from said static random access memory constitutes a store operation;
- wherein the capability of said non-volatile memory to transmit said bit of data back to said static random access memory constitutes a recall operation;
- means for operatively connecting said memory cell to a power supply;
- means for operatively connecting said memory cell to a ground; and
- means, located between said memory cell and said means for operatively connecting said memory cell to the ground, for limiting the current to be provided by the power supply to said memory cell;
- wherein said non-volatile memory differentially stores said bit of data in a first semiconductor device with a first threshold that, if exceeded, causes said first semiconductor device to conduct current and in a second semiconductor device with a second threshold that is different than said first threshold and, if exceeded, causes said second semiconductor device to conduct current;
- wherein said first and second thresholds are established so that at least one of said first and second semiconductor devices conduct current during said recall operation.

13. A non-volatile, static random access memory device with current limiting, comprising:

a memory cell comprising:
- a static random access memory that is capable of receiving a bit of data from an exterior environment, retaining said bit of data, and transmitting said bit of data to the exterior environment;
- wherein said bit of data can be lost if power is removed from said static random access memory;
- a non-volatile memory, operatively connected to said static random access memory, that is capable of receiving said bit of data from said static random access memory prior to the possible removal of power from said memory cell, retaining said bit of data even after removal of power from said memory cell, and transmitting said bit of data back to said static random access memory when power is being provided to said memory cell;
- wherein the capability of said non-volatile memory to receive said bit of data from said static random access memory constitutes a store operation;
- wherein the capability of said non-volatile memory to transmit said bit of data back to said static random access memory constitutes a recall operation;
- means for operatively connecting said memory cell to a power supply;
- means for operatively connecting said memory cell to a ground; and
- means, located between said memory cell and said means for operatively connecting said memory cell to the ground, for limiting the current to be provided by the power supply to said memory cell;
- wherein said non-volatile memory differentially stores said bit of data in a first semiconductor device with a first threshold that, if exceeded, causes said first semiconductor device to conduct current and in a second semiconductor device with a second threshold that is different than said first threshold and, if exceeded, causes said second semiconductor device to conduct current;
- wherein said first threshold is susceptible to decay and if said first threshold decays beyond a first limit, said recall operation is not possible;
- wherein said second threshold is also susceptible to decay and if said second threshold decays beyond a second limit, said recall operation is not possible;

wherein said first limit is located between said second threshold and said second limit.

14. A non-volatile, static random access memory device with current limiting, comprising:
   a memory cell comprising:
      a static random access memory that is capable of receiving a bit of data from an exterior environment, retaining said bit of data, and transmitting said bit of data to the exterior environment;
      wherein said bit of data can be lost if power is removed from said static random access memory;
      a non-volatile memory, operatively connected to said static random access memory, that is capable of receiving said bit of data from said static random access memory prior to the possible removal of power from said memory cell, retaining said bit of data even after removal of power from said memory cell, and transmitting said bit of data back to said static random access memory when power is being provided to said memory cell;
      wherein the capability of said non-volatile memory to receive said bit of data from said static random access memory constitutes a store operation;
      wherein the capability of said non-volatile memory to transmit said bit of data back to said static random access memory constitutes a recall operation;
   means for operatively connecting said memory cell to a power supply;
   means for operatively connecting said memory cell to a ground; and
   means, located between said memory cell and said means for operatively connecting said memory cell to the ground, for limiting the current to be provided by the power supply to said memory cell;
   wherein said non-volatile memory differentially stores said bit of data in a first semiconductor device with a first threshold that, if exceeded, causes said first semiconductor device to conduct current and a second semiconductor device with a second threshold that is different than said first threshold and, if exceeded, causes said second semiconductor device to conduct current;
   wherein said first threshold is susceptible to decay and if said first threshold decays beyond a first limit, said recall operation is not possible;
   wherein said second threshold is also susceptible to decay and if said second threshold decays beyond a second limit, said recall operation is not possible;
   wherein at least one of said first limit and said second limit is variable.

15. A non-volatile, static random access memory array with improved current limiting, comprising:
   a first memory cell comprised of a first static random access memory for communicating a first bit of data with an exterior environment in an SRAM operation and retaining said first bit of data, wherein said first static random access memory is capable of losing said bit of data if power is removed therefrom, said first memory cell further comprised of a first non-volatile memory that is capable of communicating said first bit of data with said first static random access memory in a store or recall operation, wherein said first non-volatile memory is capable of retaining said first bit of data even after power has been removed from said first memory cell;
   first means for operatively connecting said first memory cell to a power supply;
   first means for operatively connecting said first memory cell to a ground;
   a first resistor means, located between said first memory cell and said first means for operatively connecting said first memory cell to ground, for limiting the current to be provided by the power supply to said first memory cell during a recall operation;
   a second memory cell comprised of a second static random access memory for communicating a second bit of data with an exterior environment in an SRAM operation and retaining said second bit of data, wherein said second static random access memory is capable of losing said bit of data if power is removed therefrom, said second memory cell further comprised of a second non-volatile memory that is capable of communicating said second bit of data with said second static random access memory in a store or recall operation, wherein said second non-volatile memory is capable of retaining said second bit of data even after power has been removed from said second memory cell;
   second means for operatively connecting said second memory cell to a power supply;
   second means for operatively connecting said second memory cell to a ground;
   a second resistor means, located between said second memory cell and said second means for operatively connecting said second memory cell to ground, for limiting the current to be provided by the power supply to said second memory cell during a recall operation; and
   means for connecting said first resistor in parallel with said second resistor to provide a reduced resistance to said first memory cell during an SRAM operation in said first memory cell.

16. A non-volatile, static random access memory array, as claimed in claim 15, wherein:
   said first resistor means includes a first variable resistor; and
   said second resistor means includes a second variable resistor.

17. A non-volatile, static random access memory array, as claimed in claim 16, further comprising:
   means for controlling said first and said second variable resistors so that each provides a high resistance during a recall operation and a low resistance during an SRAM operation.

18. A non-volatile, static random access memory array, as claimed in claim 15, further comprising:
   a third memory cell comprised of a third static random access memory and a third non-volatile memory as set forth with respect to said first memory cell; and
   third means for operatively connecting said third memory cell to a power supply;
   wherein said first resistor means is operatively connected to said third memory cell.

* * * * *